United States Patent
Lupp et al.

(10) Patent No.: US 8,570,748 B2
(45) Date of Patent: Oct. 29, 2013

(54) PLANAR ELECTRICAL POWER ELECTRONIC MODULES FOR HIGH-TEMPERATURE APPLICATIONS, AND CORRESPONDING PRODUCTION METHODS

(75) Inventors: Friedrich Lupp, München (DE); Karl Weidner, München (DE)

(73) Assignee: Siemens Aktiengesellschaft, Munich (DE)

( * ) Notice: Subject to any disclaimer, the term of this patent is extended or adjusted under 35 U.S.C. 154(b) by 271 days.

(21) Appl. No.: 13/002,110

(22) PCT Filed: Jun. 16, 2009

(86) PCT No.: PCT/EP2009/057406
§ 371 (c)(1),
(2), (4) Date: Dec. 30, 2010

(87) PCT Pub. No.: WO2010/000605
PCT Pub. Date: Jan. 7, 2010

(65) Prior Publication Data
US 2011/0107594 A1    May 12, 2011

(30) Foreign Application Priority Data
Jul. 2, 2008  (DE) .......................... 10 2008 031 231

(51) Int. Cl.
*H05K 7/20*      (2006.01)
*H01L 23/48*     (2006.01)

(52) U.S. Cl.
USPC ........... 361/719; 361/704; 361/728; 257/666; 257/668

(58) Field of Classification Search
None
See application file for complete search history.

(56) References Cited

U.S. PATENT DOCUMENTS

| | | | |
|---|---|---|---|
| 5,379,187 A * | 1/1995 | Lee et al. ........................ | 361/707 |
| 5,870,289 A | 2/1999 | Tokuda et al. ................. | 361/779 |
| 5,896,271 A | 4/1999 | Jensen et al. ................... | 361/719 |
| 6,555,906 B2 * | 4/2003 | Towle et al. .................... | 257/723 |
| 6,580,611 B1 | 6/2003 | Vandentop et al. ............ | 361/704 |
| 6,603,210 B2 * | 8/2003 | Kishimoto et al. ............. | 257/781 |
| 7,067,356 B2 * | 6/2006 | Towle et al. .................... | 438/122 |
| 7,135,782 B2 * | 11/2006 | Nishikawa ..................... | 257/796 |
| 7,170,162 B2 * | 1/2007 | Chang ............................ | 257/700 |
| 7,242,582 B2 * | 7/2007 | Kurauchi et al. .............. | 361/704 |
| 7,449,370 B2 * | 11/2008 | Tanaka ........................... | 438/123 |
| 7,449,726 B2 * | 11/2008 | Nakanishi et al. ............. | 257/177 |
| 7,488,903 B2 * | 2/2009 | Kawagishi et al. ............ | 174/385 |
| 7,642,640 B2 * | 1/2010 | Shinohara ...................... | 257/699 |
| 7,679,914 B2 * | 3/2010 | Kashiwazaki ................. | 361/714 |
| 7,800,233 B2 * | 9/2010 | Kawano et al. ................ | 257/774 |
| 2007/0235810 A1 | 10/2007 | Delgado et al. ................ | 257/356 |
| 2010/0089633 A1 | 4/2010 | Kaspar ........................... | 174/382 |

FOREIGN PATENT DOCUMENTS

DE   102005037869 A1    2/2007
EP       0607656 A      7/1994

OTHER PUBLICATIONS

International PCT Search Report, PCT/EP2009/057406, 10 pages, Mailed Oct. 2, 2009.

* cited by examiner

*Primary Examiner* — Boris Chervinsky
(74) *Attorney, Agent, or Firm* — King & Spalding L.L.P.

(57) ABSTRACT

With respect to an electronic component, in particular a power module, and in a corresponding method for producing or contact-connecting said component, the component (1) is fastened to an electrically insulating carrier film (3) having at least one first inorganic material and at least one opening (5) in which at least one electrical contact-connection (7) of the component (1) to outside the component (1) is provided. This makes it possible to provide electronic components (1), in particular power modules, for a temperature range of >175 DEG C.

12 Claims, 2 Drawing Sheets

PLANAR ELECTRICAL POWER ELECTRONIC MODULES FOR HIGH-TEMPERATURE APPLICATIONS, AND CORRESPONDING PRODUCTION METHODS

CROSS-REFERENCE TO RELATED APPLICATIONS

This application is a U.S. National Stage Application of International Application No. PCT/EP2009/057406 filed Jun. 16, 2009, which designates the United States of America, and claims priority to DE Application No. 10 2008 031 231.2 filed Jul. 2, 2008. The contents of which are hereby incorporated by reference in their entirety.

TECHNICAL FIELD

The present invention relates to a method for creating at least one electronic component of a module and to an electronic component of a module.

BACKGROUND

In accordance with planar connection technology, especially for the proprietary Siemens technology referred to as SiPLIT, the insulation of the contact conductor track is created by applying an insulating film, especially featuring a polymer, over the electrical components to Direct Copper Bond substrates (DCB substrate). These types of conventional structuring and connection technologies, such as this SiPLIT technology for example, but also bonding, make possible numerous variants for power electronics applications subjected to thermal stresses up to 150° C.

Conventional bond technology in particular is the yardstsick in respect of the production costs of power components and modules. Furthermore there is a plurality of variants related to bonding, such as ribbon bonding and the like. In the production of power modules components are essentially attached to Direct Copper Bond substrates by soldering on electronic components or chips and/or Surface Mounted Devices (SMDs). For planar connection technology, especially for Siemens proprietary SiPLIT technology, the insulation and structuring of the contact conductor tracks is provided by the application of a laser-structured insulation film. Subsequently the electrical connections are created by a structuring process and by electrolytic metal removal corresponding to the SiPLIT process technology.

In accordance with the prior art the ability to withstand temperatures over the long term is restricted to <175° C. by the use of polymer insulation films.

As well as the need to fulfill technical requirements and characteristics, there is a demand for power modules for applications >200° C. which are new, innovative and especially low-cost. There is an increasing demand for modules able to be used at temperatures >200° C.

SUMMARY

According to various embodiments, components, especially power modules, can be provided for a temperature range especially in excess of 175° C. In such cases electrical insulation in particular should give effective electrical insulation, effective adhesion and be thermomechanically stable. In particular high-temperature packages should especially be created for power electronics which are thermally stable over the entire lifetime of the module.

According to an embodiment, a method for creating at least one electronic component of a module, may comprise: Cutting out of at least one opening intended for at least one electrical contact-connection of the component in an electrically-insulating carrier film comprising at least one first inorganic material; Positioning and fixing the electrical component on the carrier film; Creating the electrical contact-connection to outside the electronic component, wherein exclusively inorganic or multi-bonded inorganic insulation materials are used for constructing the module.

According to a further embodiment, the method may comprise filling of spaces between electronic component, carrier film and a leadframe with a fill layer comprising at least one second inorganic material for electrical insulation of the electronic component by means of a high-temperature package. According to a further embodiment, the first and/or second inorganic material can be a ceramic high-temperature material, especially in an inorganic composite matrix. According to a further embodiment, the first and/or second inorganic material can be glass, boron nitride, boron carbide, high-temperature cement, silicon nitride, mixed ceramic, aluminum oxide, silicon carbide and/or a ceramic adhesive. According to a further embodiment, the fill layer may have a multilayer structure, with the individual layers being adapted to different requirements and especially being applied by means of spraying on or laminating. According to a further embodiment, an adhesion agent, for example Silane, can be applied between the individual layers to provide effective adhesion between the individual layers. According to a further embodiment, a coating, for example Al(OH)$_3$, can be applied to the fill layer for closing and healing the pores and tears of the last layer, especially by means of screen printing, spraying, dipping, lamination or painting. According to a further embodiment, the method may comprise the step of creation of the electrical contact-connection by means of applying at least one structured, flat, electrical conductor layer especially consisting of Cu, Ni/Au, Ag, Sn—Ag in the opening and/or to at least one side of the electrically-insulating carrier film. According to a further embodiment, the method may further comprise creating the conductor layer by means of electroplating or imprinting. According to a further embodiment, the method may further comprise creating the electrical contact-connection by means of electrical contacting, for example by means of soldiering or welding the conductor layer to at least one leadframe which especially consists of copper. According to a further embodiment, the method may further comprise positioning the component by means of AOI on a temporary fixing means surface. According to a further embodiment, the method may further comprise looping back the fill layer to the side of the component or of a further component facing away from the carrier film. According to a further embodiment, the method may further comprise applying at least one heat sink and/or further contact-connections to the electrical contact-connection and/or to the side of the component facing away from the carrier film.

According to another embodiment, an electronic component of a module may be attached to an electrically-insulating carrier film comprising at least one inorganic material, which has at least one opening in which at least one electrical contact-connection of the component to the outside is provided, wherein exclusively inorganic or multi-bonded inorganic insulation materials are used to construct the module. According to a further embodiment of the component, a fill layer may comprise at least one second inorganic material for electrical insulation of the electronic components by means of a high-temperature package, with the fill layer filling spaces between the electronic component, carrier film and a leadframe.

According to a further embodiment of the component, the first and/or second inorganic material can be a ceramic high-temperature material, especially in an inorganic composite matrix. According to a further embodiment of the component, the first and or second inorganic material can be glass, boron nitride, boron carbide, high-temperature cement, silicon nitride, mixed ceramic, aluminum oxide, silicon carbide and/or a ceramic adhesive. According to a further embodiment of the component, the fill layer may have a multilayer structure, with the individual layers being adapted to different requirements. According to a further embodiment of the component, an adhesion agent, for example Silane, can be embodied between the individual layers to provide effective adhesion between the individual layers. According to a further embodiment of the component, a layer, for example of Al $(OH_3)$ can be applied to the fill layer for closing and healing the pores and tears of the last layer. According to a further embodiment of the component, the electrical contact-connection can be created by applying at least one structured, flat, electrical conductor layer, especially consisting of Cu, Ni/Au, Ag, Sn—Ag in the opening and/or to at least one side of the electrically-insulating carrier film. According to a further embodiment of the component, the conductor layer may be created by means of electroplating or printing. According to a further embodiment of the component, the electrical contact-connection can be created by means of electrical contacting of the conductor layer to at least one leadframe which especially consists of copper. According to a further embodiment of the component, The component may have been positioned by means of AOI on a temporary fixing means surface. According to a further embodiment of the component, the fill layer may have been looped back to the side of the component or of a further component facing away from the carrier film. According to a further embodiment of the component, at least one heat sink and/or further contact-connections may be applied to the electrical contact-connection and/or to the side of the component facing away from the carrier film.

BRIEF DESCRIPTION OF THE DRAWINGS

The present invention will be explained in greater detail with reference to exemplary embodiments in conjunction with the figures. The figures show.

DETAILED DESCRIPTION

Figure 1:
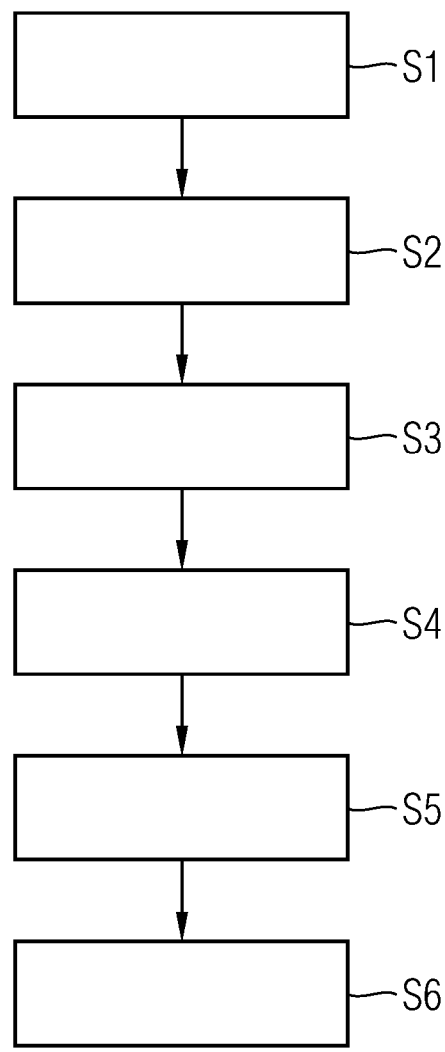
FIG. 1 an exemplary embodiment of a method.

As a solution a module structure is especially proposed which makes use of inorganic materials, such as glass or ceramic for example. In this way high-temperature packages, especially for power electronics which are subjected to a high temperature throughout their lifetime, are provided through the use of inorganic or multi-bonded inorganic insulation materials such that a high degree of electrical insulation, an effective adhesion and stable thermomechanics are created.

Openings are cut out in a carrier film, electronic components and for example leadframes are positioned and fixed to a carrier film. Furthermore contact-connections are made between electronic components and for example leadframes and other components. The structure according to various embodiments can preferably be used for productive series fabrication of components or modules in large numbers, preferably for conventional power modules. The use of thermally-conductive, highly-electrically-insulating structured inorganic materials resistant to high temperatures, i.e. able to withstand temperatures >175° C., enables many benefits to be gained: Good thermal bonding, including of side surfaces by good shape adaptability, good thermal management and a high dielectric strength for high-voltage applications. Further benefits are improved reliability, reduced power loss, high current densities, integration capability, compact structure, flexible layout and electromagnetic screening. Improved reliability brings about sufficient long-term stability.

The openings in the carrier film can be created in particular by laser cutting.

In accordance with an embodiment, spaces are filled with a fill layer comprising at least one second inorganic material for electrical insulation. The spaces are insulated by using inorganic materials. The fill layer has a layer thickness of 100 to 400 micrometers. In particular spaces between the electronic component, the carrier film and a leadframe are filled. A three-dimensionally shaped leadframe is an electrically conductive, especially metallic, three-dimensionally shaped structure, for example in the form of the grid, which can be produced for example by low-cost punching, etching and/or bending, for example on a roll or in strips. Three-dimensionally shaped means in particular bent out of one plane Suitable materials are preferably Cu alloys, for example tin bronze CuSn6 or SB02, i.e. Cu98Fe2. Typical thicknesses range from 0.2 to 0.5 mm. By contrast with the three-dimensionally shaped leadframes defined here, flat leadframes are also used. The generic term for three-dimensionally shaped lead frames and flat leadframes is leadframe. In the exemplary embodiments a three-dimensional leadframe in the shape of a punched-bent part or punched grid is used.

In accordance with a further embodiment the first and/or second inorganic material is a ceramic high-temperature material which is especially provided by spraying, dipping or sintering and is provided especially in an inorganic or organic composite matrix.

In accordance with a further embodiment the first and/or second inorganic material is glass which is created for example by melting glass beads at a temperature of 400° C., boron nitride, boron carbide, high-temperature cement, silicon nitride, mixed ceramics, aluminum oxide, multi-bonded silicon carbide and/or a ceramic adhesive such as the product "Ceramacoat" made by Kager for example. SiC modules can be provided. Silicon carbide is advantageous compared to Si electronics, especially in respect of switching frequencies, operating temperatures and power densities. The material can be applied by means of sputtering processes, Chemical Vapor Deposition (CVD) or plasma methods.

In accordance with a further embodiment the fill layer has a multilayer structure, with the individual layers being adapted to different requirements and applied by means of spraying on or laminating. Ceramic layers in particular can meet the different requirements, meaning typically longitudinal expansion, electrical insulation or adhesion, through a multilayer structure. For example the first coat is adapted to the longitudinal expansion coefficient of a baseplate such as a direct copper bond substrate or a copper baseplate for example. A coating can be created for example by means of spraying on, and this can involve plasma spraying, flame spraying, vacuum and low-pressure spraying, or likewise by means of lamination of the individual layers.

In accordance with a further embodiment an adhesion agent, for example Silane, is applied between the individual layers to provide an effective adhesion between the individual layers. This type of adhesion agent also brings about a good adhesion to the individual layers.

In accordance with a further embodiment a layer, for example Al $(OH_3)$, for closing and healing the pores and tears of the last layer is applied to the fill layer, especially by means of screen print spraying, dipping, lamination, painting. The thickness is also of great importance. In this case typical sealers, such as sol-gel based on epoxy and silicon resins for example, are created. In this way an improved reliability, reduced power losses, high current densities, integration capability, compact structure, flexible layout and electromagnetic shielding are created by the stacking option, i.e. a sandwich structure.

In accordance with a further embodiment the electrical contact-connections are created by applying at least one structured, flat, electrical conductor layer especially consisting of Cu—Ni/Au, Ag, Sn—Ag in the opening and/or on at least one side of the electrically-insulating carrier film. A suitable thin, insulating carrier film made of inorganic material such as a glass film for example, typically with Cu metallization structured on both sides and especially with openings assigned to the contact surfaces, such as source, gate and drain contacts for example, is provided. Component contact surfaces are provided in accordance with the connection method, for example in a previous wafer level process with the functional layers suitable for the connection methods, for example Cu, Ni/Au, Ag, SnAg metallizations.

In accordance with a further embodiment the conductor layer is created by means of electroplating or imprinting. For making contact by metallic means a temporary fixing means surface, for example an adhesive surface or a adhesive base, also serves as a seal, i.e. liquid is prevented from penetrating between the carrier film and the electronic components or any possible Cu leadframes. The conductor track structures or contact-connections can also be created in accordance with specified data by a printing process after pre-preparation of the electronic components has been created.

In accordance with a further embodiment the electrical contact-connection is created by means of electrical contacting, especially by means of soldering or welding the conductor layer to at least one leadframe, which especially consists of copper. A Cu leadframe adapted to the layout, especially applied on both sides via metallization, typically metallic through-contacting, soldered connections, welded connections can be provided in openings in the glass for example as the contacting. A large-surface component contacting possible on both sides through Cu leadframes can typically be undertaken by means of standard soldering methods or likewise by means of solderless connecting methods such as for example Nano Ag, laser/ultrasound welding and the like. External connections can also be created at low cost at the same time by means of the design and shaping of leadframes, especially Cu leadframes. The use of leadframe connection technology and automatic processes enables the electronic components or power modules to be provided at low cost.

In accordance with a further embodiment the component is fixed to a temporary fixing means surface by means of automatic optical inspection (AOI). A positioning of the electronic components undertaken in accordance with AOI on a temporary fixing means surface makes possible exact assignment to the contact surfaces, for example the leadframes. With contacting by metallic means this fixing means surface also serves as a seal, meaning that liquid is prevented from penetrating between the carrier film and the chips or the Cu leadframes. As an alternative, thin hydrophobic layers can also be applied at critical points.

In accordance with a further embodiment the fill layer is looped back to the side of the component or a further component facing away from the carrier film.

In accordance with a further embodiment heat sinks and/or further contact-connections are applied to the electrical contact-connections and/or to the side of the component facing away from the carrier film. This produces a double-sided cooling which brings about improved reliability, reduced power loss, high current densities, integration capability, a compact structure and a flexible layout. Heat sinks and/or rear-side contact-connections are applied. Comparable add-ons can likewise be provided. If necessary the pre-prepared component upper and/or lower side can be designed for improving the thermal management in addition for example with thick, structured Cu blocks for short-term removal of heat in the event of a short circuit.

In accordance with a further embodiment, embedded systems can be provided by means of integration and multi-layer constructions of the components.

FIG. 1 shows an exemplary embodiment of a method, with said method having the following steps. Step S1 involves cutting out the openings in a carrier film. In step S2 the electronic components, leadframes and so forth are positioned on and fixed to the carrier film. Step S3 comprises the filling up of the spaces. Step 4 involves a looping back of the space-filler material to the rear side of the electronic component or of other components. Step S5 involves establishing contact between electronic components and leadframes and other components. Step S6 involves applying heat sinks and/or further rear-side contact-connections.

Figure 2:
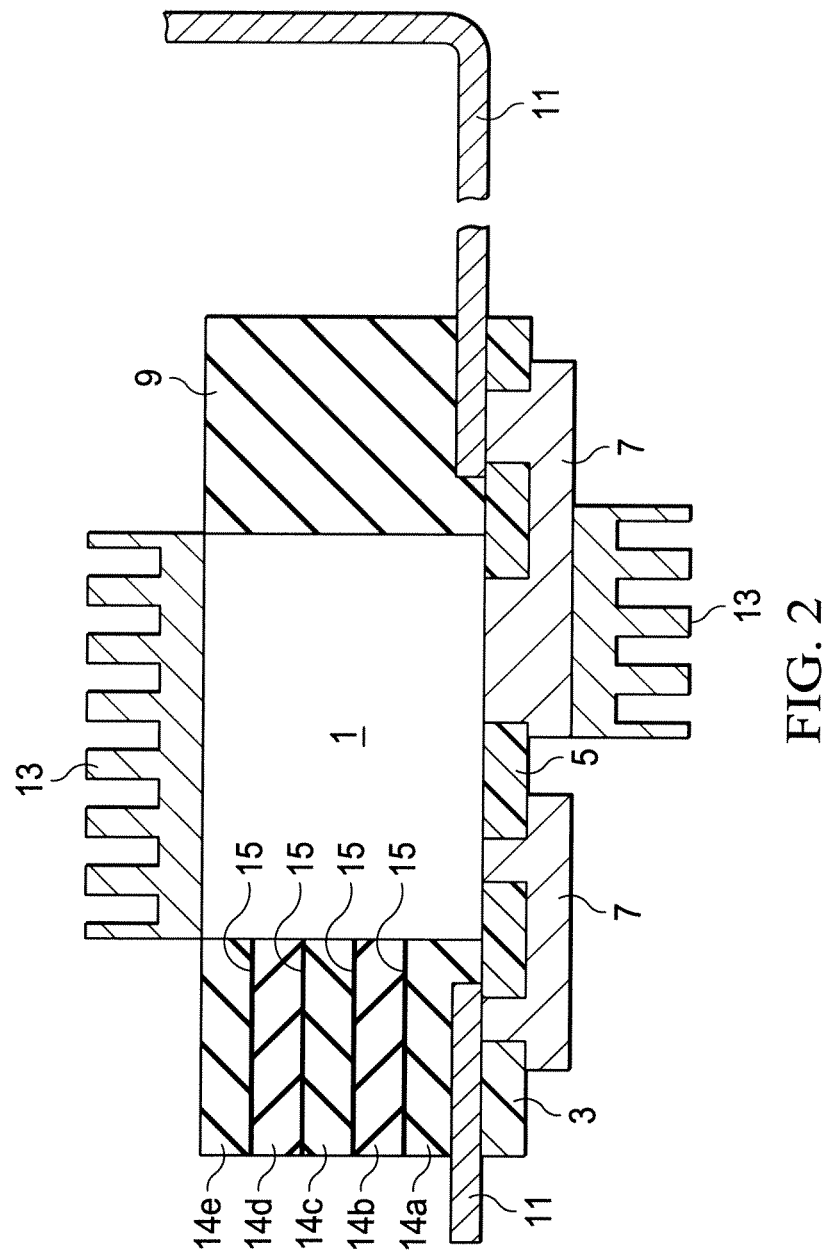
FIG. 2 an exemplary embodiment of an electronic component or electronic power module.

In accordance with a further FIG. 2 an exemplary embodiment of an electronic component or electronic power module is presented. Reference sign 1 refers to an electronic component, which is a field effect transistor for example. Other electronic components are likewise possible. Reference character 3 identifies an electrically-insulating carrier film comprising at least one inorganic material. The component 1 is attached to the electrically-insulating carrier film comprising at least one inorganic material. The carrier film 3 features at least one opening 5 in which at least one electrical contact-connection 7 of the component 1 to outside the component 1 is provided. Outside also means out of a power module. Reference sign 9 identifies a fill layer for electrical insulation comprising at least one second inorganic material for filling spaces. In such cases spaces are typically the areas between electronic components 1, carrier foil 3 and a leadframe 11. In such cases the fill layer 9 can have a multilayer structure, with the individual layers 14a-14e being adapted to different requirements. Embodied between the individual layers can be an adhesion agent 15 for providing effective adhesion between the individual layers 14a-14e. Applied to the fill layer 9 can be a layer for closing and healing the pores and tears in the last layer. In FIG. 2 the last layer is the topmost layer 14e of the fill layer 9. FIG. 2 shows that the electrical contact-connection 7 is created by means of electrical contacting between a conductor layer 7 and at least one leadframe 11 which especially consists of copper. External connections are created at low cost through the design and shaping of the leadframe 11. Reference sign 13 identifies the least one heat sink and/or further contact-connections on the electrical contact-connection 7 and/or on the side of the components 1 facing away from the carrier film 3. FIG. 2 shows an inorganic-based power module for high-temperature applications of greater than 175° C., especially of greater than 200° C.

What is claimed is:

1. An electronic component of a module, wherein the component is attached to an electrically-insulating carrier film comprising at least one first inorganic material, which has at least one opening in which at least one electrical contact-connection of the component to the outside is provided, wherein the at least one first inorganic material comprises exclusively inorganic or multi-bonded inorganic insulation materials.

2. The electronic component according to claim 1, further comprising: a fill layer comprising at least one second inorganic material for electrical insulation of the electronic components by means of a high-temperature package, with the fill layer filling spaces between the electronic component, carrier film and a leadframe, wherein the at least one second inorganic material comprises exclusively inorganic or multi-bonded inorganic insulation materials.

3. The electronic component according to claim 2, wherein at least one of the first and second inorganic material is a ceramic high-temperature material or a ceramic high-temperature material in an inorganic composite matrix.

4. The electronic component according to claim 2, wherein the first and or second inorganic material is at least one of glass, boron nitride, boron carbide, high-temperature cement, silicon nitride, mixed ceramic, aluminum oxide, silicon carbide and a ceramic adhesive.

5. The electronic component according to claim 2, wherein the fill layer has a multilayer structure.

6. The electronic component according to claim 5, wherein an adhesion agent is embodied between the individual layers to provide effective adhesion between the individual layers.

7. The electronic component according to claim 2, wherein a layer is applied to the fill layer for closing and healing the pores and tears of the last layer.

8. The electronic component according to claim 1, wherein the electrical contact-connection comprises at least one structured, flat, electrical conductor layer comprising at least one of Cu, Ni/Au, Ag, Sn—Ag in at least one of the opening and to at least one side of the electrically-insulating carrier film.

9. The electronic component according to claim 8, wherein the electrical contact-connection comprises, electrical contacting of the conductor layer to at least one leadframe which may consist of copper.

10. The electronic component according to claim 2, wherein the fill layer is looped back to the side of the component.

11. The electronic component according to claim 1, wherein at least one heat sink is applied to at least one of the electrical contact-connection and to the side of the component facing away from the carrier film.

12. An electronic component of a module including a plurality of insulating materials, wherein the component is attached to an electrically-insulating carrier film which has at least one opening in which at least one electrical contact-connection of the component to the outside is provided,
   a fill layer comprising electrical insulation of the electronic components by means of a high-temperature package, with the fill layer filling spaces between the electronic component, carrier film and a leadframe,
   wherein the plurality of insulating materials comprise exclusively inorganic or multi-bonded inorganic insulation materials.

* * * * *